(12) United States Patent
Lee et al.

(10) Patent No.: US 8,492,191 B2
(45) Date of Patent: Jul. 23, 2013

(54) METHOD FOR MANUFACTURING SEE-THROUGH SOLAR BATTERY MODULE

(75) Inventors: Shih-Wei Lee, Kaohsiung (TW); Ching-Ju Lin, Kaohsiung (TW); Wei-Min Huang, Taipei (TW); Jung-Tai Tsai, Tainan (TW); Chio-An Tseng, Kaohsiung (TW); Shih-Chi Wu, Kaohsiung (TW)

(73) Assignee: Axuntek Solar Energy, Pingtung, Pingtung County (TW)

( * ) Notice: Subject to any disclaimer, the term of this patent is extended or adjusted under 35 U.S.C. 154(b) by 0 days.

(21) Appl. No.: 13/472,462

(22) Filed: May 15, 2012

(65) Prior Publication Data
US 2013/0084673 A1   Apr. 4, 2013

(30) Foreign Application Priority Data

Oct. 4, 2011   (TW) .............................. 100135975 A

(51) Int. Cl.
*H01L 21/00* (2006.01)
(52) U.S. Cl.
USPC ................... 438/80; 438/57; 438/71; 438/98; 136/256; 136/249; 136/244; 257/80; 257/E31.126

(58) Field of Classification Search
USPC ................ 136/256, 249, 244; 438/57, 71, 80, 438/98; 257/80, E31.126
See application file for complete search history.

(56) References Cited

FOREIGN PATENT DOCUMENTS
TW      201106497 A1     2/2011

*Primary Examiner* — Evan Pert
*Assistant Examiner* — Mark A Laurenzi
(74) *Attorney, Agent, or Firm* — Winston Hsu; Scott Margo

(57) ABSTRACT

A method for manufacturing a see-through solar battery module includes disposing a first mask above a transparent substrate, forming a plurality of metal electrode layers alternately arranged on the transparent substrate, disposing a second mask above the transparent substrate, forming a photoelectric transducing layer on each metal electrode layer by the second mask, removing a part of each photoelectric transducing layer along a first direction to expose a part of each metal electrode layer, forming a transparent electrode layer on each photoelectric transducing layer and each metal electrode layer, and removing a part of each transparent electrode layer and a part of each photoelectric transducing layer to expose a part of each metal electrode layer so as to make the plurality of metal electrode layers and the transparent electrode layer in series connection along a second direction respectively.

13 Claims, 17 Drawing Sheets

METHOD FOR MANUFACTURING SEE-THROUGH SOLAR BATTERY MODULE

BACKGROUND OF THE INVENTION

1. Field of the Invention

The present invention relates to a method for manufacturing a solar battery module, and more specifically, to a method for manufacturing a see-through solar battery module.

2. Description of the Prior Art

Generally, the conventional solar batteries are classified as the see-through solar battery and the non see-through solar battery. The non see-through solar battery is widely applied on the building material, such as a tile structure, a hanging, and so on. On the other hand, the see-through solar battery is necessary to be applied on the specific ways, such as a transparent wall, a transparent roof, and so on, for preferable aesthetic appearance. Please refer to FIG. 1, which is a partial diagram of a see-through solar battery module 10 according to the prior art. The see-through solar battery module 10 includes a transparent substrate 12, a transparent conductive layer 14, a photoelectric transducing layer 16, and an opaque electrode layer 18. A conventional method of manufacturing the see-through solar battery module 10 is directly removing parts of the opaque electrode layer 18 and parts of the photoelectric transducing layer 16 by laser to expose parts of the transparent conductive layer 14 for transmitting beams to pass through the see-through solar battery module 10.

Due to the high working temperature of the laser, particles are formed on the transparent conductive layer 14 and the opaque electrode layer 18 easily, which results in the leaking current of the see-through solar battery module 10, or further results in the short circuit between the transparent conductive layer 14 and the opaque electrode layer 18. Instead of the laser removing method and the mechanical removing method, Taiwan patent publication No. TW201106497 discloses a method of utilizing a mask to adjust the interval between each two adjacent solar batteries on the see-through battery module. However, it is difficult for the said mask removing method to control forming of the inactive areas on the see-through solar battery module. Thus, how to manufacturing a see-through battery module with high transmittance and a simplified manufacturing process is an important issue of the solar industry.

SUMMARY OF THE INVENTION

The present invention provides a method for manufacturing a see-through solar battery module. The method includes disposing a first mask above a transparent substrate, forming a plurality of metal electrode layers alternately arranged on the transparent substrate, disposing a second mask above the transparent substrate, forming a photoelectric transducing layer on each metal electrode layer by the second mask, removing a part of each photoelectric transducing layer along a first direction to expose a part of each metal electrode layer, forming a transparent electrode layer on each photoelectric transducing layer and each metal electrode layer, and removing a part of each transparent electrode layer and a part of each photoelectric transducing layer to expose a part of each metal electrode layer so as to make the plurality of metal electrode layers and the transparent electrode layer in series connection respectively along a second direction different from the first direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
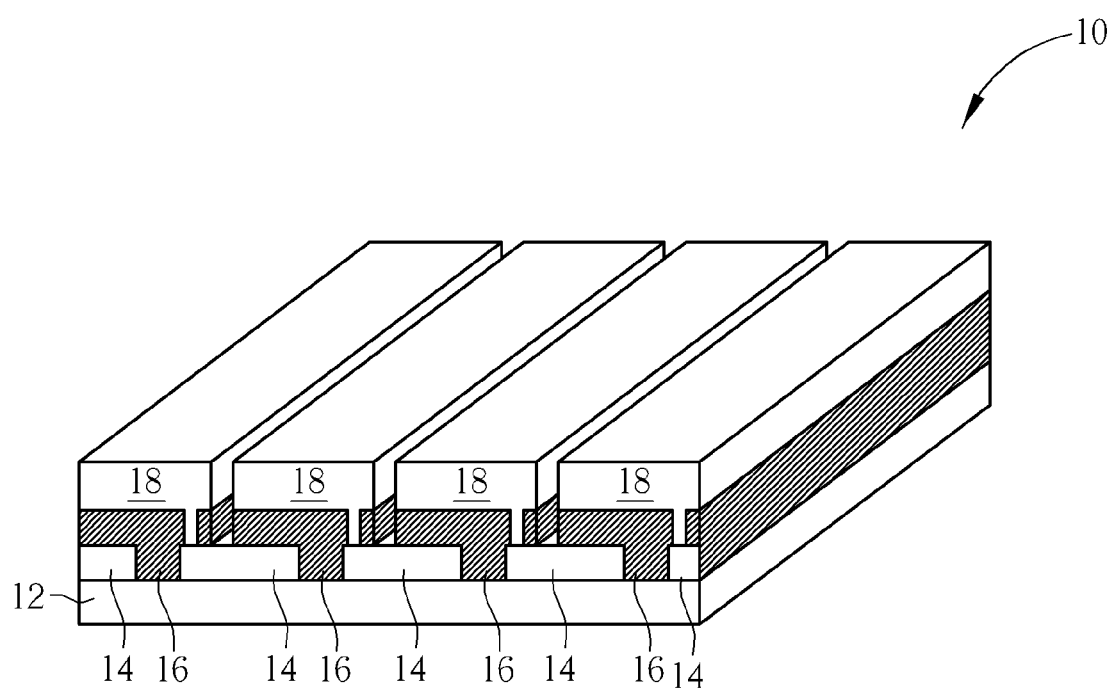
FIG. 1 is a partial diagram of a see-through solar battery module according to the prior art.
Figure 2:
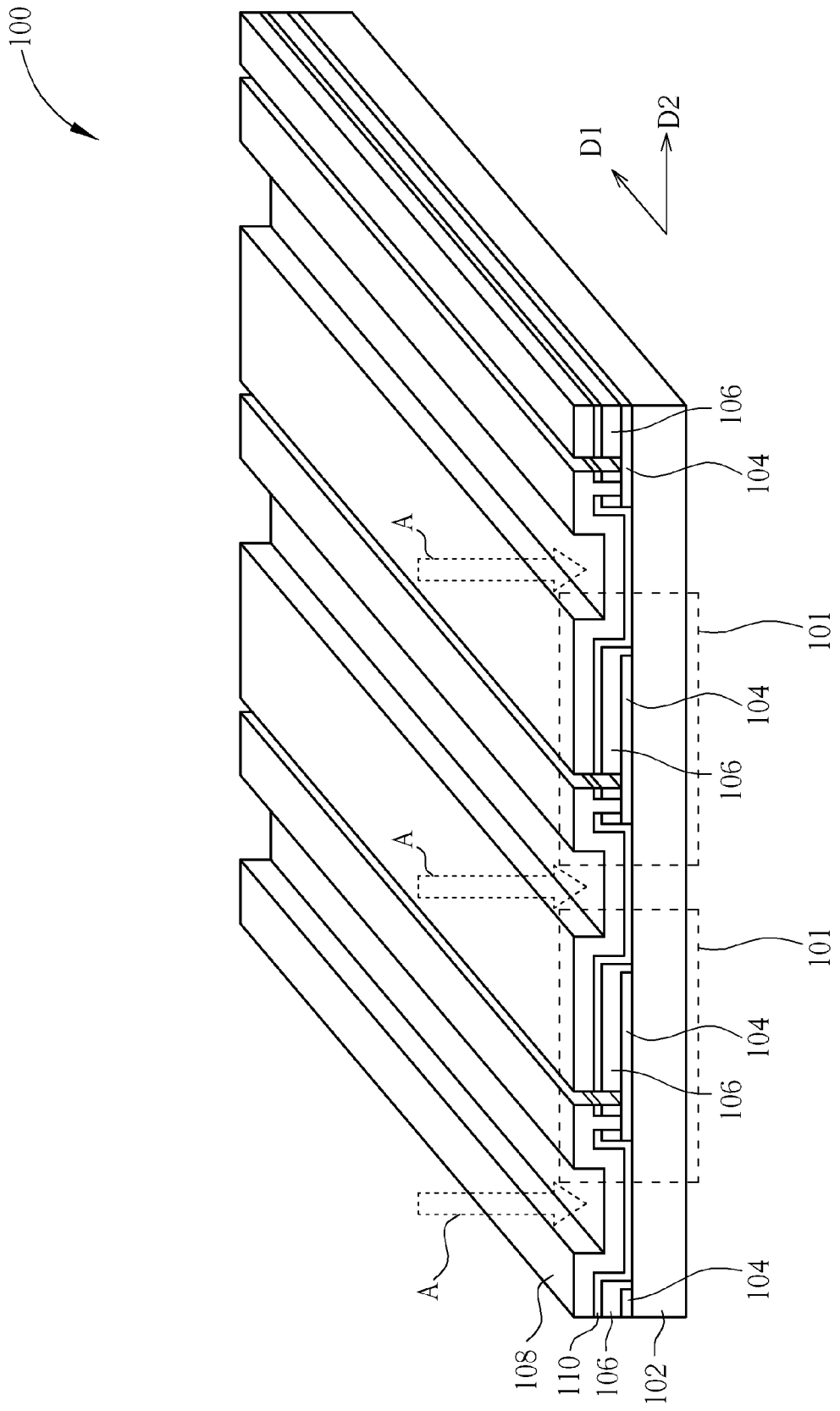
FIG. 2 is a diagram of a see-through solar battery module according to a first embodiment of the present invention.

Please refer to FIG. 2, which is a diagram of a see-through solar battery module 100 according to a first embodiment of the present invention. The see-through solar battery module 100 includes a transparent substrate 102, a plurality of metal electrode layers 104 and corresponding photoelectric transducing layers 106. The plurality of metal electrode layers 104 is alternately arranged on the transparent substrate 102. Each photoelectric transducing layer 106 is formed on the corresponding metal electrode layer 104 along a first direction D1. Each photoelectric transducing layer 106 does not contact the adjacent photoelectric transducing layer 106 along a second direction D2, and each metal electrode layer 24 does not contact the adjacent metal electrode layer 24 along the second direction D2.

The see-through solar battery module 100 further includes a plurality of transparent electrode layers 108. Each transparent electrode layer 108 is formed on each metal electrode layer 104 and each photoelectric transducing layer 106 along the first direction D1. The see-through solar battery module 100 can be consisted of a plurality of solar batteries 101. The photoelectric transducing layer 106 of the solar battery 101 can transform solar energy into electric power, and the metal electrode layer 104 and the transparent electrode layer 108 can respectively be a positive electrode and a negative electrode of the solar battery 101 for outputting the electric power. Therefore, the plurality of metal electrode layers 104 is electrically connected to the plurality of transparent electrode layers 108 along the second direction D2, meaning that the plurality of solar batteries 101 is in series connection along the second direction D2 which is substantially perpendicular to the first direction D1. In such a manner, a user can adjust an outputting voltage of the see-through solar battery module 100 according to actual demand. In addition, the see-through solar battery module 100 further includes a buffer layer 110 disposed between the photoelectric transducing layer 106 and the transparent electrode layer 108.

Generally, the transparent substrate 102 can be made of soda-lime glass and be selectively in a curved shape. The metal electrode layer 104 can be made of molybdenum (Mo) material, Tantalum (Ta) material, Titanium (Ti) material, Vanadium (V) material, or Zirconium (Zr) material. The photoelectric transducing layer 106 can be a copper indium selenide (CIS) composition having a P-type semiconductor structure, such as copper indium selenide, copper indium sulfide (CIS), copper indium gallium selenide (CIGS), or copper indium gallium selenide sulfide (CIGSS). The transparent electrode layer 108 can be a conductive layer made of aluminum zinc oxide (AZO) or tin-doped indium oxide (ITO) material. The buffer layer 110 can be made of cadmium sulfide (CdS), zinc sulfide (ZnS) material or indium sulfide (In$_2$S$_3$) and intrinsic zinc oxide (ZnO) material. Material of the transparent substrate 102, the metal electrode layer 104, the photoelectric transducing layer 106, the transparent electrode layer 108, and the buffer layer 110 is not limited to the above-mentioned embodiment, and depends on design demand. Due to the transparent property of the soda-lime glass, AZO (or ITO), and the intrinsic ZnO, beams can pass through the see-through solar battery module 100 along arrows A in FIG. 2, and the user can view the scene through the see-through solar battery module 100.

Figure 3:
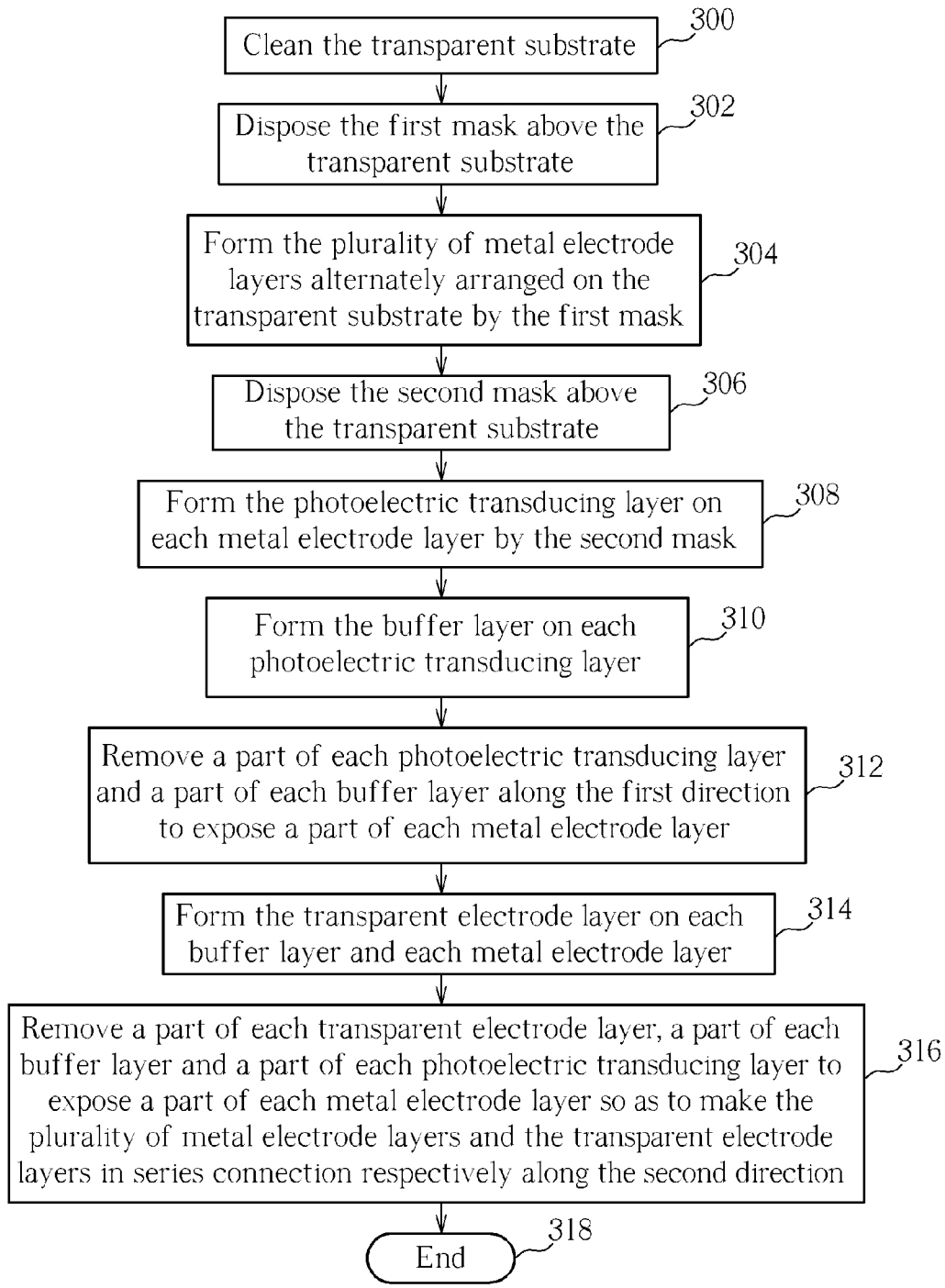
FIG. 3 is a flowchart of a method for manufacturing the see-through solar battery module in FIG. 2.

Please refer to FIG. 2 and FIGS. 3-10. FIG. 3 is a flowchart of the method for manufacturing the see-through solar battery module 100 in FIG. 2. FIGS. 4-10 are sectional views of the see-through solar battery module 100 along the second direction D2 in different procedures in FIG. 2. The method includes the following steps.

Step 300: Clean the transparent substrate 102;

Step 302: Dispose a first mask 112 above the transparent substrate 102;

Step 304: Form the plurality of metal electrode layers 104 alternately arranged on the transparent substrate 102 by the first mask 112;

Step 306: Dispose a second mask 114 above the transparent substrate 102;

Step 308: Form the photoelectric transducing layer 106 on each metal electrode layer 104 by the second mask 114;

Step 310: Form the buffer layer 110 on each photoelectric transducing layer 106;

Step 312: Remove a part of each photoelectric transducing layer 106 and a part of each buffer layer 110 along the first direction D1 to expose a part of each metal electrode layer 104;

Step 314: Form the transparent electrode layer 108 on each buffer layer 110 and each metal electrode layer 104;

Step 316: Remove a part of each transparent electrode layer 108, a part of each buffer layer 110 and a part of each photoelectric transducing layer 106 to expose a part of each metal electrode layer 104 so as to make the plurality of metal electrode layers 104 and the transparent electrode layers 108 in series connection respectively along the second direction D2;

Step 318: End.

Figure 4:
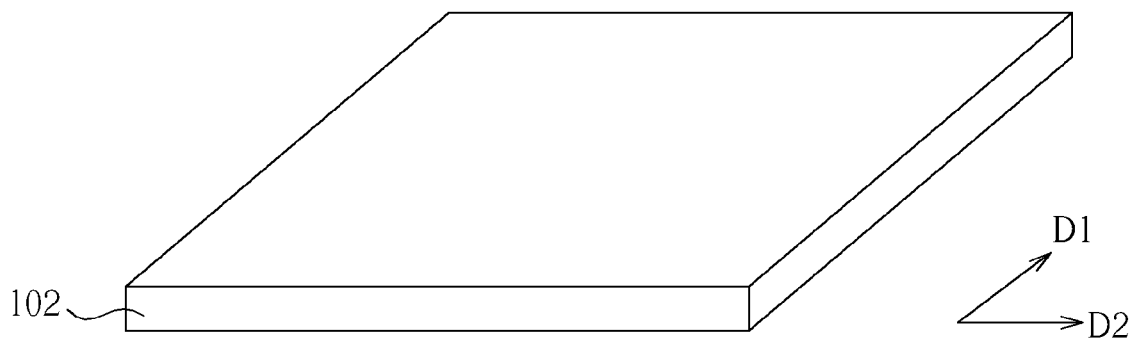
FIGS. 4-10 are sectional views of the see-through solar battery module in FIG. 2 along a second direction in different procedures.

More detailed description for the said steps is introduced as follows. In Step 300, as shown in FIG. 4, the transparent substrate 102 in FIG. 4 is cleaned for preventing dirt from heaping on the transparent substrate 102. At this time, a barrier layer made of Al$_2$O$_3$ or SiO$_2$ material can be selectively formed on the transparent substrate 102, for preventing crystallization of the photoelectric transducing layer 106 from being influenced by diffusion of impurity in the transparent substrate 102. Furthermore, NaF material can be formed on the transparent substrate 102 by an evaporation process or a sputtering process for crystallizing the CIS film on the transparent substrate 102.

Figure 5:
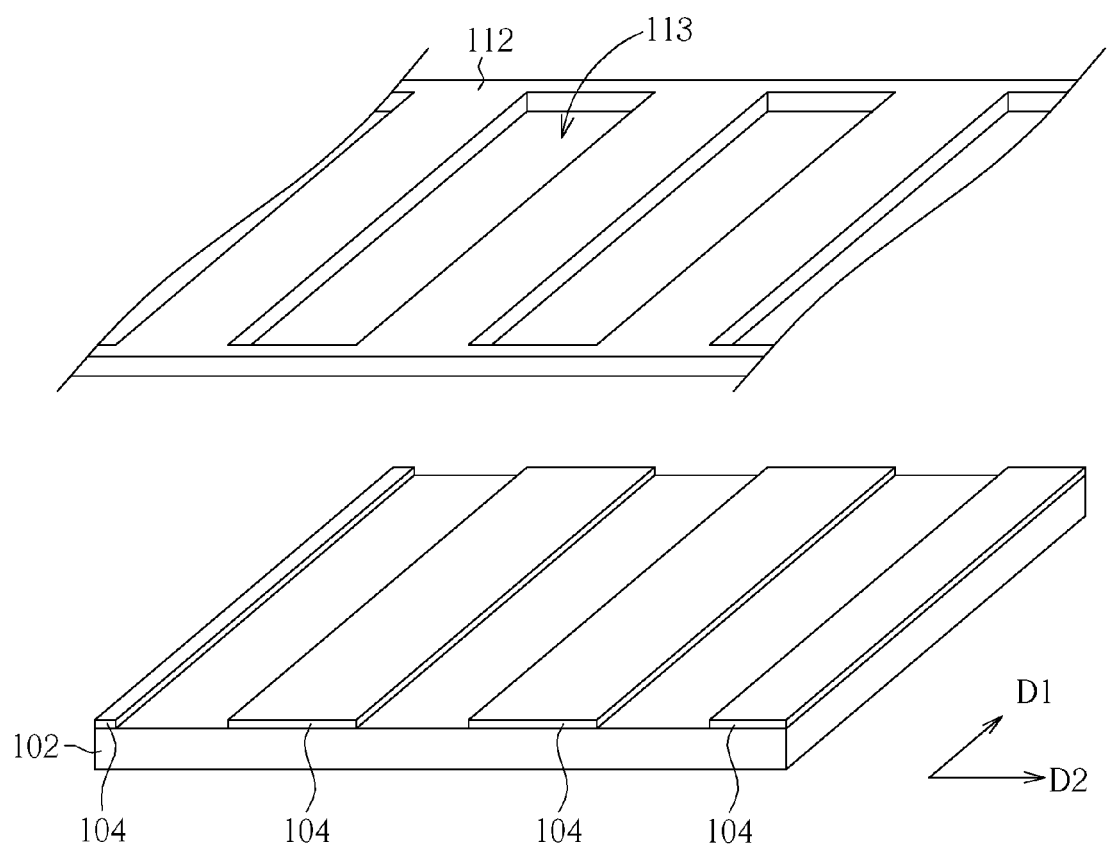
Figure 6:
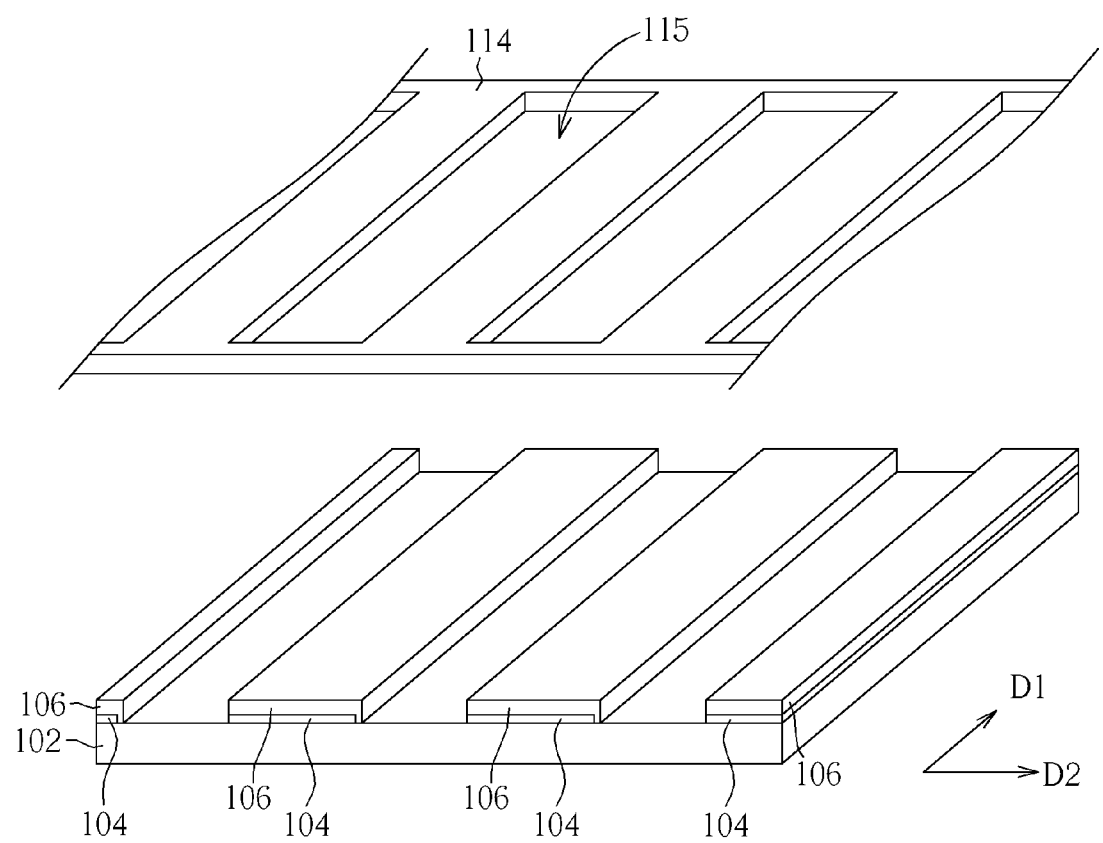

Subsequently, as shown in FIG. 5, after the first mask 112 is disposed above the transparent substrate 102 (Step 302), the metal electrode layer 104 can be formed on the transparent substrate 102 by the first mask 112 by a sputtering process or other forming technology. Since the first mask 112 has the plurality of first holes 113 formed along the first direction D1 as shown in FIG. 5, the plurality of metal electrode layers 104 can be formed on the transparent substrate 102 in an alternately-arranged manner (Step 304). Next, as shown in FIG. 6, after the second mask 114 is disposed above the transparent substrate 102 (Step 306), the photoelectric transducing layer 106 can be formed on the transparent substrate 102 via the second mask 114 by a thin film deposition process or other forming technology. Since the second mask 114 has the plurality of second holes 115 formed along the first direction D1 as shown in FIG. 6, the photoelectric transducing layer 106 can be formed on each metal electrode layer 104 accordingly as shown in FIG. 6 (Step 308).

Figure 7:
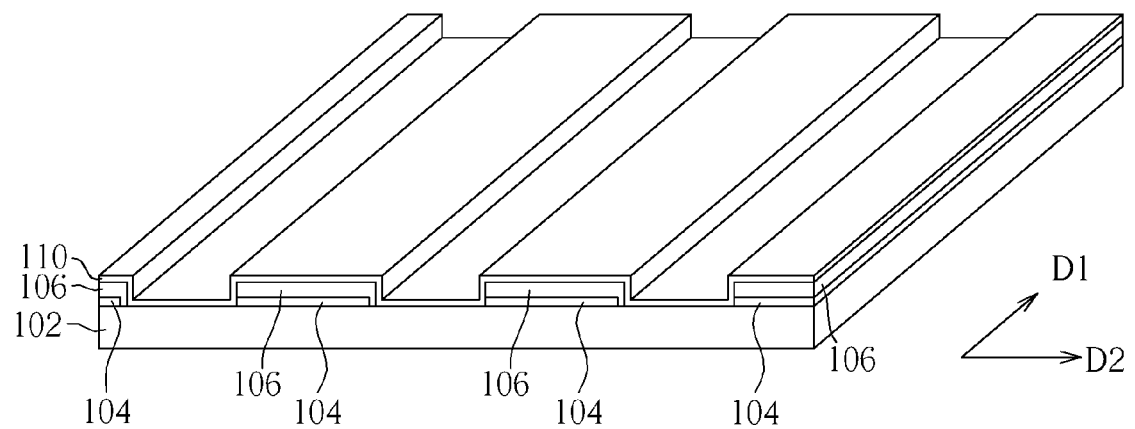
Figure 8:
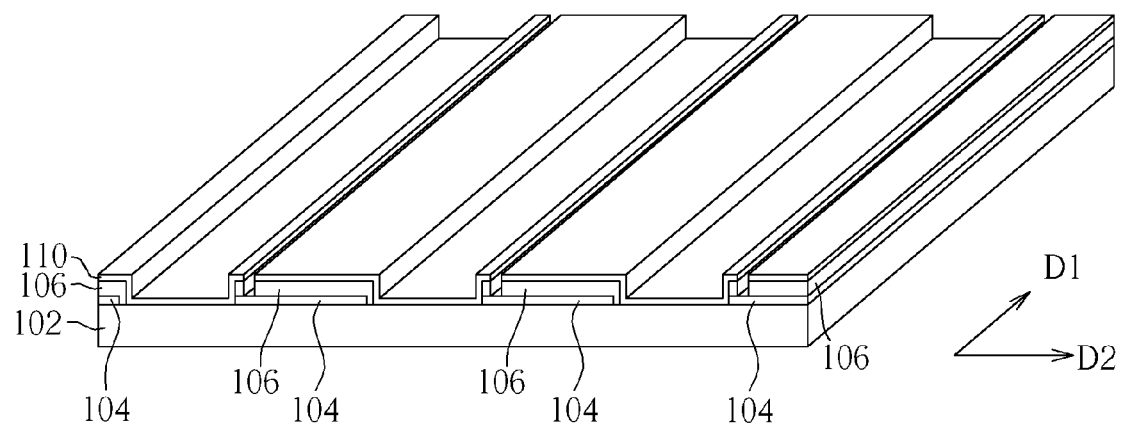

Subsequently, as shown in FIG. 7 and FIG. 8, the buffer layer 110 can be formed on the photoelectric transducing layer 106 (Step 310) by thin film deposition technology (e.g. a sputtering process or a chemical bath deposition process), and then the part of each buffer layer 110 and the part of each photoelectric transducing layer 106 can be removed along the first direction D1 by a scraper or other removing technology, so as to expose the part of each metal electrode layer 104 (Step 312). Thus, the purpose of preventing the buffer layer 110 from being formed on the transparent substrate 102 can be achieved accordingly so as to make the see-through solar battery module 10 have preferable transmittance. The buffer layer 110 is a transparent film having preferable photoelectric property for increasing the photoelectric transducing efficiency and the electricity generating efficiency of the see-through solar battery module 100. Generally, the thin film deposition technology can be realized by a co-evaporation process, a vacuum sputter process, a rapid thermal process and a selenization process to achieve preferable photoelectric transducing efficiency of the CIS film.

Figure 9:
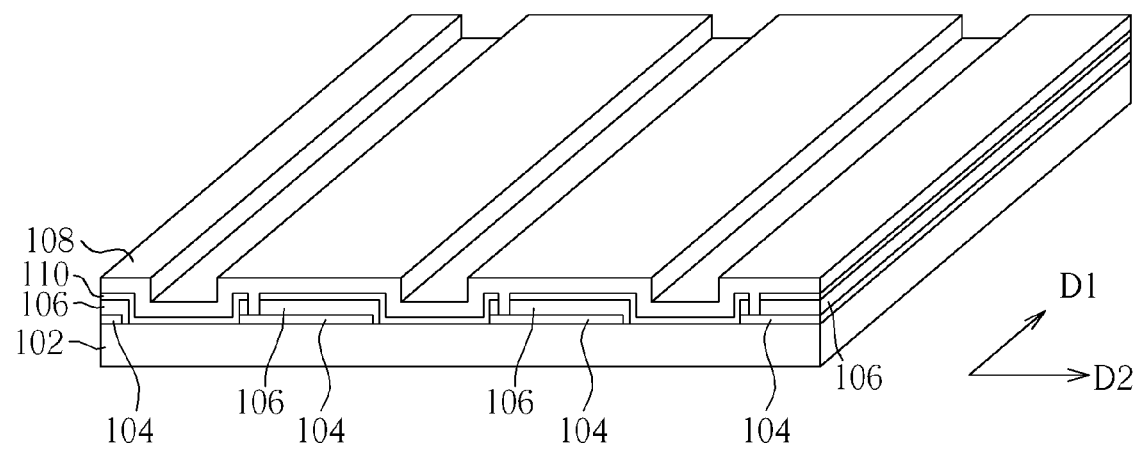
Figure 10:
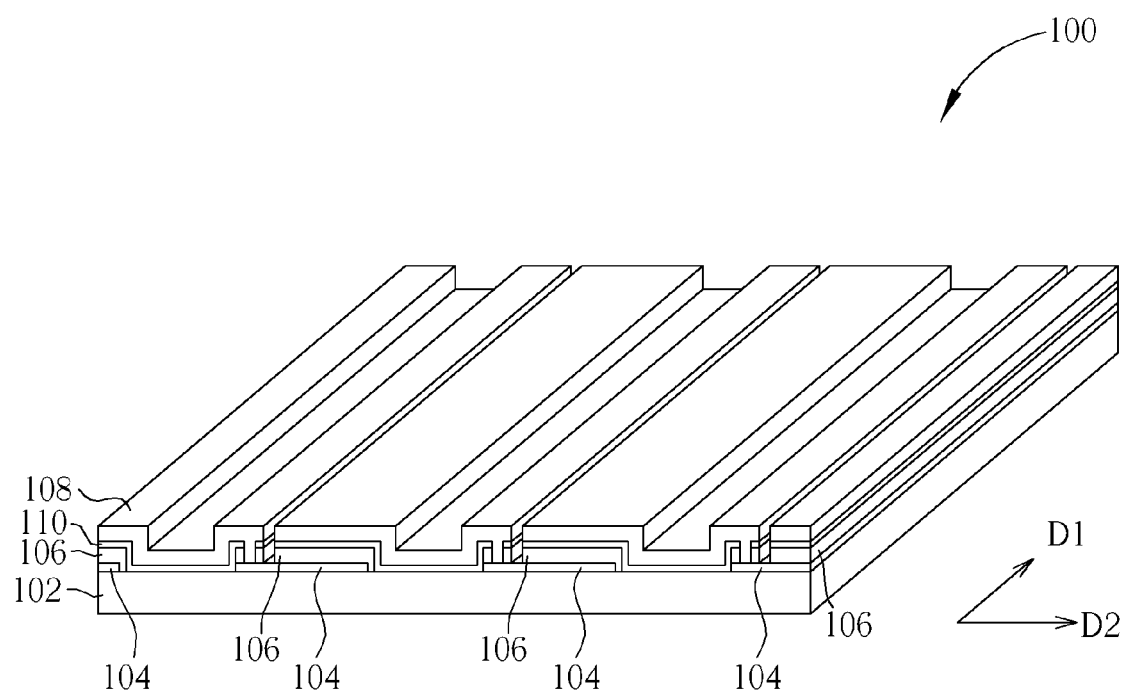

Next, as shown in FIG. 9 and FIG. 10, after the transparent electrode layer 108 is formed on the buffer layer 110 and the metal electrode layer 104 (Step 314), the part of each transparent electrode layer 108, the part of each buffer layer 110, and the part of each photoelectric transducing layer 106 are removed along the first direction D1 (Step 316). In such a manner, the see-through solar battery module 100 can include the plurality of solar batteries 101, and the metal electrode layer 104 and the transparent electrode layer 108 of each solar battery 101 are in series connection along the second direction D2. Each transparent area (indicated by the arrows A) of the see-through solar battery module 100 are formed by the transparent electrode layer 108, the buffer layer 110 and the transparent substrate 102 for passing the beams, so that directions of the illumination fringes are different from the disposition of the solar battery 101.

Method of the present invention can prevent the metal electrode layer 104 and the photoelectric transducing layer 106 from being formed on the part of the transparent substrate 102 by utilizing the first mask 112 and the second mask 114, so that the see-through solar battery module 100 not only has preferable transmittance, but also simplifies the manufacturing process of the see-through solar battery module 100 and solves the current leaking problem by omitting the step of utilizing the laser removing method. To be noted, material and manufacturing procedures of the buffer layer 110 are not limited to the above-mentioned embodiment, meaning that Step 310 is a selectable procedure.

Figure 11:
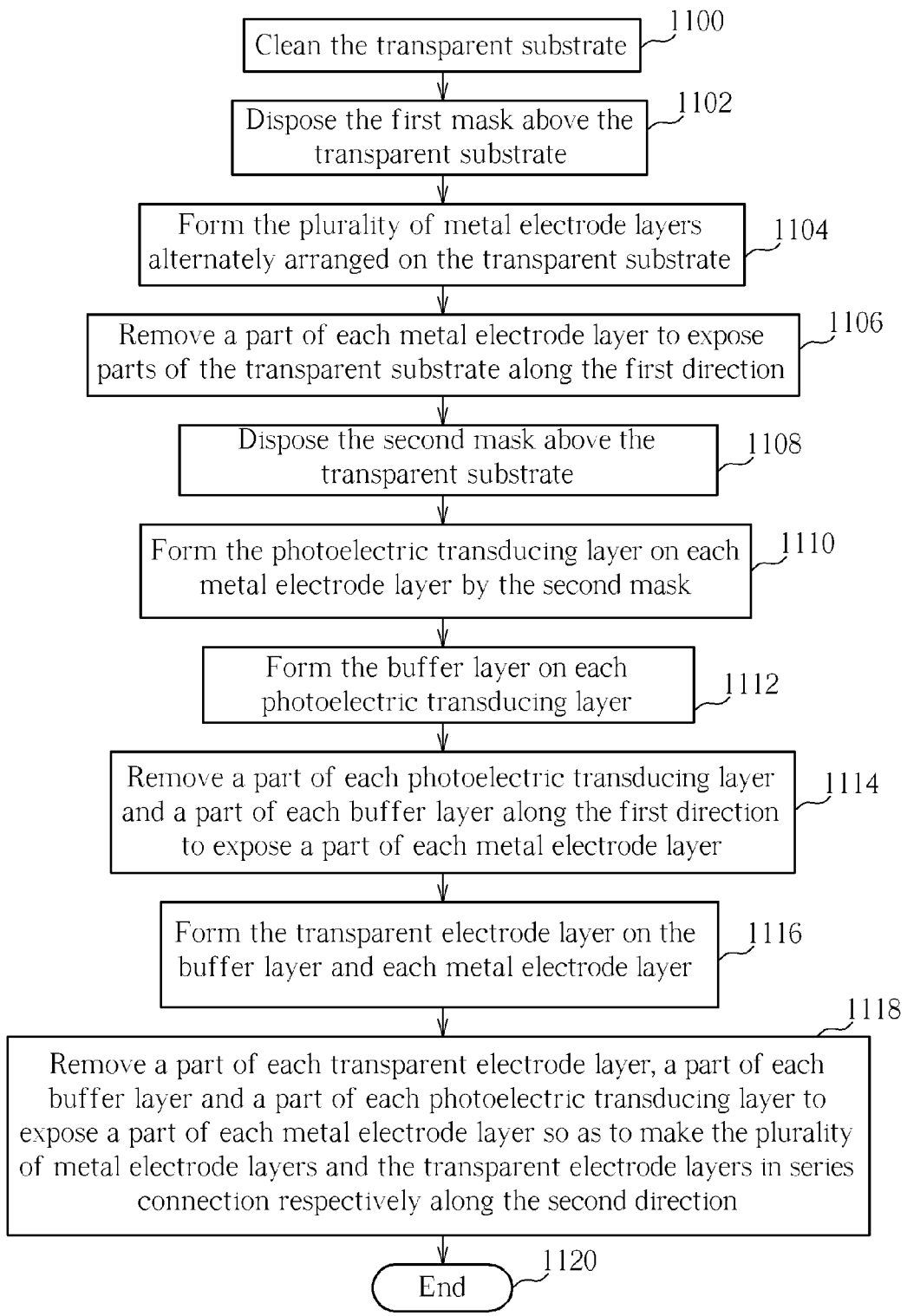
FIG. 11 is a flowchart of a method for manufacturing a see-through solar battery module according to a second embodiment of the present invention.

Please refer to FIGS. 11-17. FIG. 11 is a flowchart of the method for manufacturing a see-through solar battery module 100' according to a second embodiment of the present invention. FIGS. 12-17 are sectional views of the see-through solar battery module 100' along the second direction D2 in different procedures. The method includes the following steps.

Step 1100: Clean the transparent substrate 102;

Step 1102: Dispose a first mask 112' above the transparent substrate 102;

Step 1104: Form the plurality of metal electrode layers 104 alternately arranged on the transparent substrate 102;

Step 1106: Remove a part of each metal electrode layer 104 to expose parts of the transparent substrate 102 along the first direction D1;

Step 1108: Dispose a second mask 114' above the transparent substrate 102;

Step 1110: Form the photoelectric transducing layer 106 on each metal electrode layer 104 by the second mask 114';

Step 1112: Form the buffer layer 110 on each photoelectric transducing layer 106;

Step 1114: Remove a part of each photoelectric transducing layer 106 and a part of each buffer layer 110 along the first direction D1 to expose a part of each metal electrode layer 104;

Step 1116: Form the transparent electrode layer 108 on the buffer layer 110 and each metal electrode layer 104;

Step 1118: Remove a part of each transparent electrode layer 108, a part of each buffer layer 110 and a part of each photoelectric transducing layer 106 to expose a part of each metal electrode layer 104 so as to make the plurality of metal electrode layers 104 and the transparent electrode layers 108 in series connection respectively along the second direction D2;

Step 1120: End.

The major difference between the second embodiment and the first embodiment is forming of the holes on the mask. In the second embodiment, the first mask 112' has a plurality of first holes 113' formed along the second direction D2 and the second mask 114' has a plurality of second holes 115' formed along the second direction D2.

Figure 12:
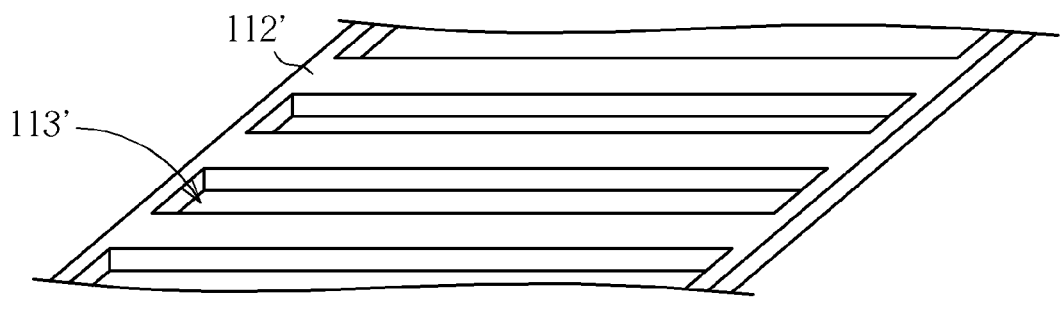
FIGS. 12-17 are sectional views of the see-through solar battery module along the second direction D2 in different procedures.
Figure 12:
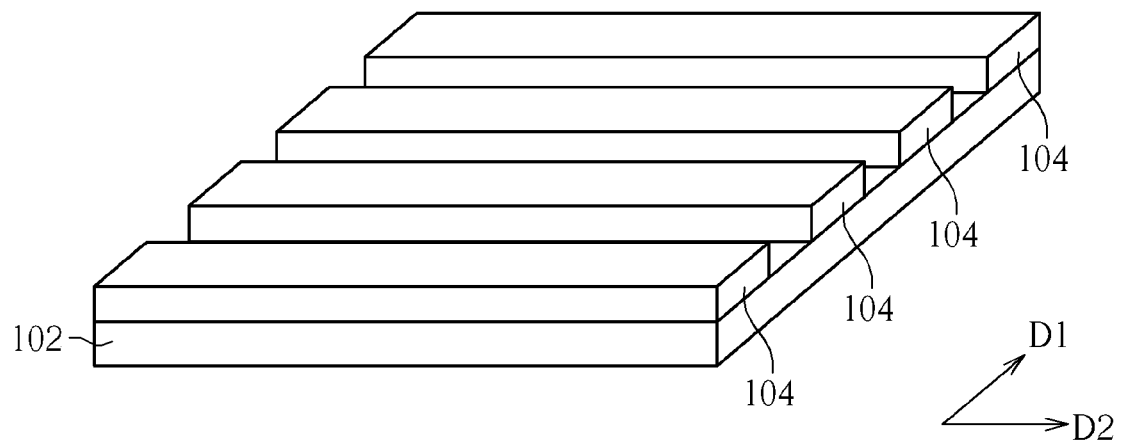
Figure 13:
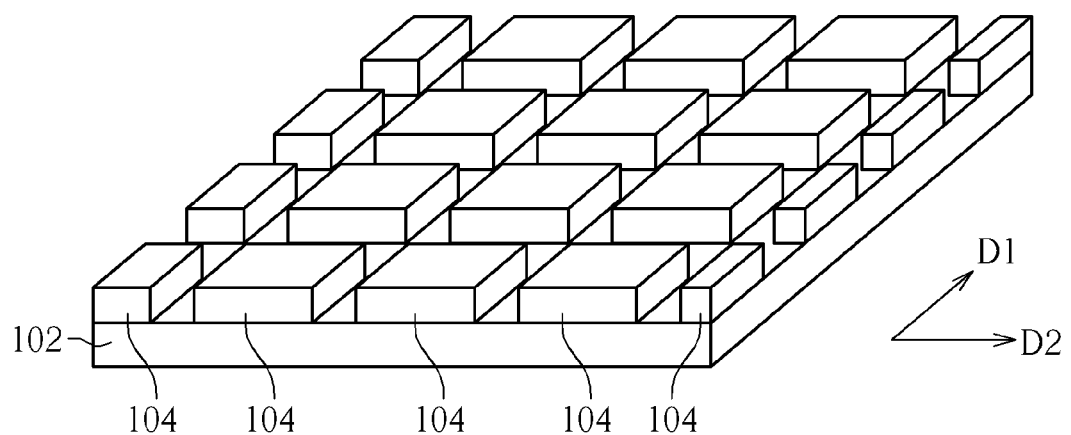

More detailed description for the said steps is introduced as follows. After the steps 1100-1106 are performed sequentially, the plurality of metal electrode layers 104 are alternately arranged on the transparent substrate 102. In brief, the transparent substrate 102 in FIG. 12 is first cleaned, and the first mask 112 is then disposed above the transparent substrate 102. Subsequently, the metal electrode layers 104 can be formed on the transparent substrate 102 via the first mask 112' by a sputtering process or other forming technology. In this embodiment, the plurality of metal electrode layers 104 can be formed on the transparent substrate 102 in a horizontally-arranged manner as shown in FIG. 12 since the first mask 112' has the plurality of first holes 113' formed along the second direction D2, and then the plurality of metal electrode layers 104 can be formed on the transparent substrate 102 as shown in FIG. 13 by utilizing laser to remove the part of each metal electrode layer 104 for exposing the parts of the transparent substrate 102.

Figure 14:
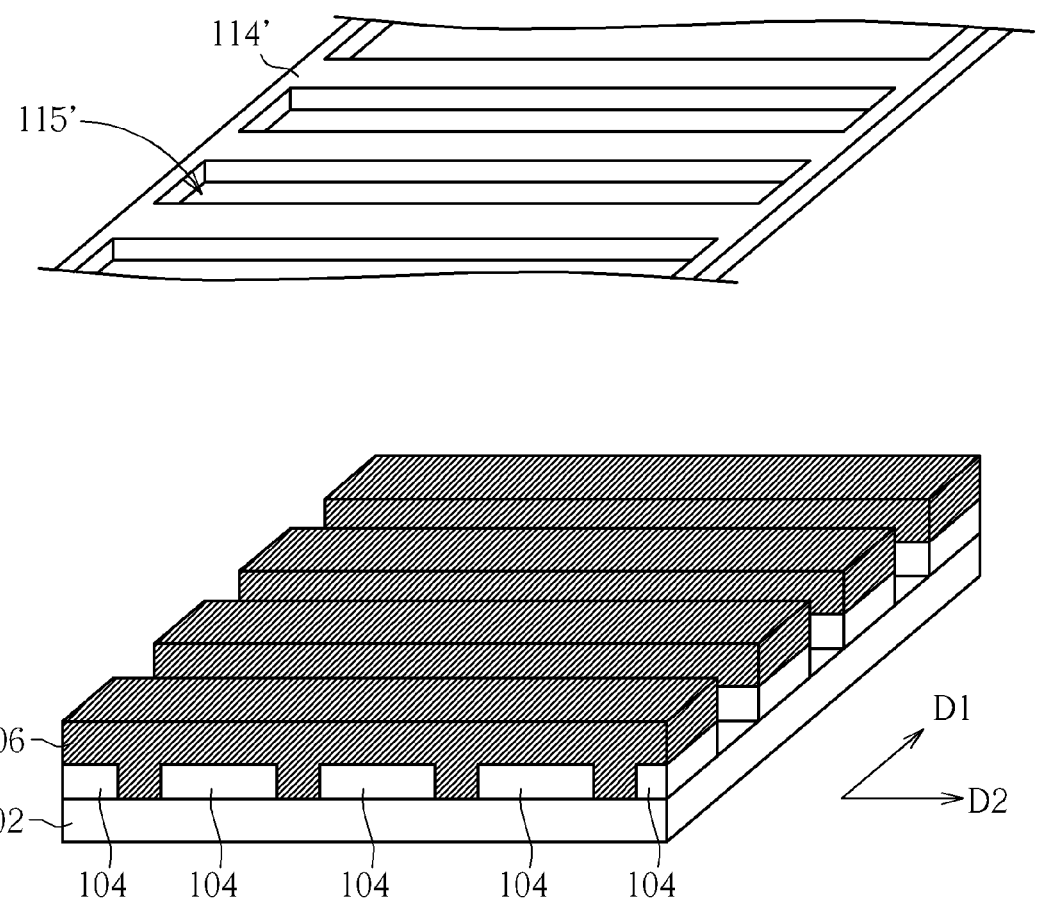

Next, as shown in FIG. 14, after the second mask 114' is disposed above the transparent substrate 102 (Step 1108), the photoelectric transducing layer 106 can be formed on the transparent substrate 102 via the second mask 114' by a thin film deposition process or other forming technology. Since the second mask 114' has the plurality of second holes 115' formed along the second direction D2 as shown in FIG. 14, the photoelectric transducing layer 106 can be formed on each metal electrode layer 104 accordingly as shown in FIG. 14 (Step 1110).

Figure 15:
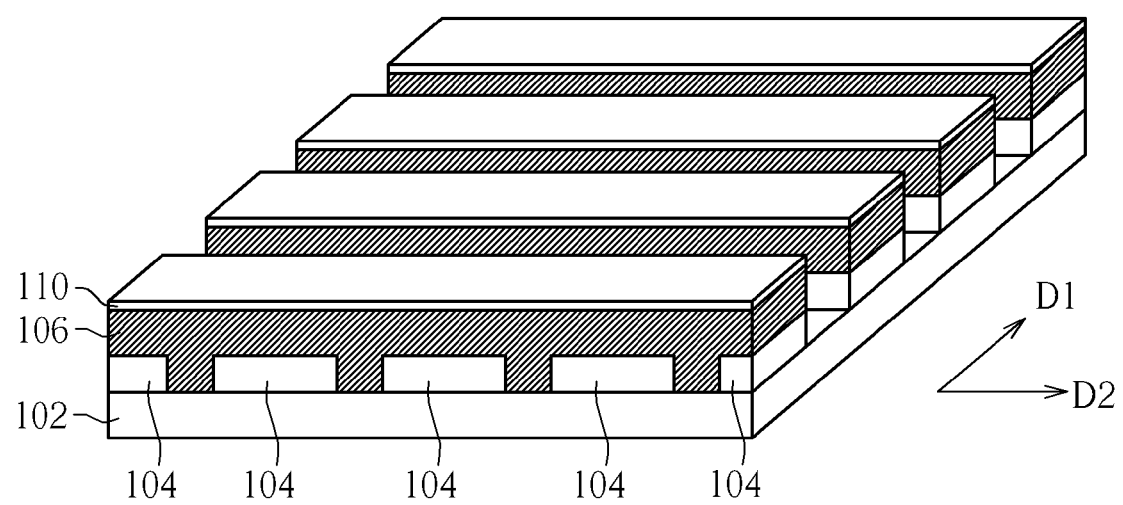

Subsequently, as shown in FIG. 15, the buffer layer 110 can be formed on the photoelectric transducing layer 106 (Step 1112) by thin film deposition technology (e.g. a sputtering process or a chemical bath deposition process). To be noted, in Step 1112, the buffer layer 110 can be simultaneously formed on the photoelectric transducing layer 106 and the transparent substrate 102. Thus, for preventing the buffer layer 110 from being formed on the transparent substrate 102 to influence transmittance of the see-through solar battery module 100', a scraper or other removing technology can be further utilized to remove the part of the buffer layer 110 located on the transparent substrate 102 along the second direction D2 after the buffer layer 110 is formed by the thin film deposition technology. The said disposition of the buffer layer 110 can be as shown in FIG. 15, but not limited thereto. That is, the present invention can utilize the design that the second mask 114' is kept located above the transparent substrate 102 during the forming process of the buffer layer 110 instead, for achieving the same purpose of preventing the buffer layer 114 from being formed on the transparent substrate 102. As for which design is utilized, it depends on design demand.

Figure 16:
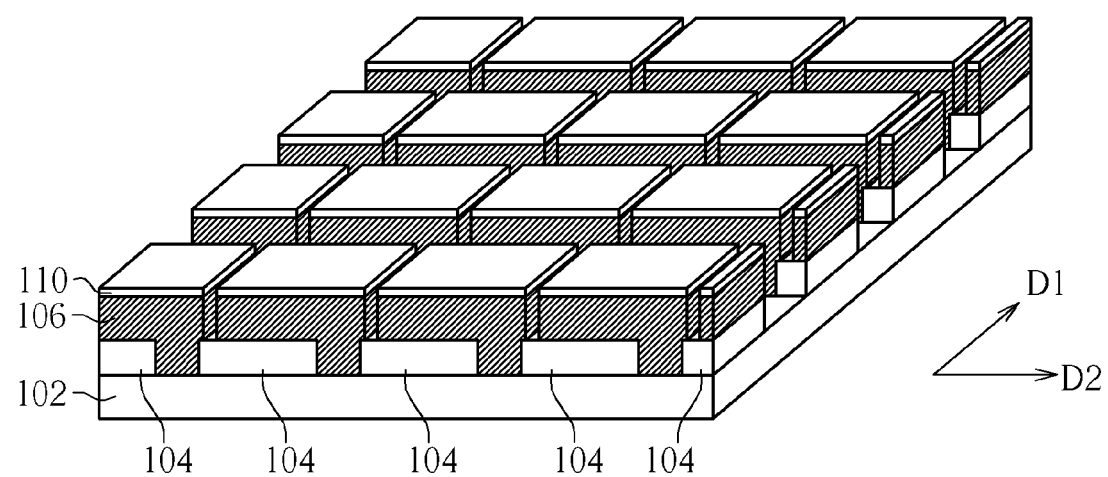

Next, the part of each buffer layer 110 and the part of each photoelectric transducing layer 106 can be removed along the first direction D1 by a scraper or other removing technology, so as to expose the part of each metal electrode layer 104 (as shown in FIG. 16).

Figure 17:
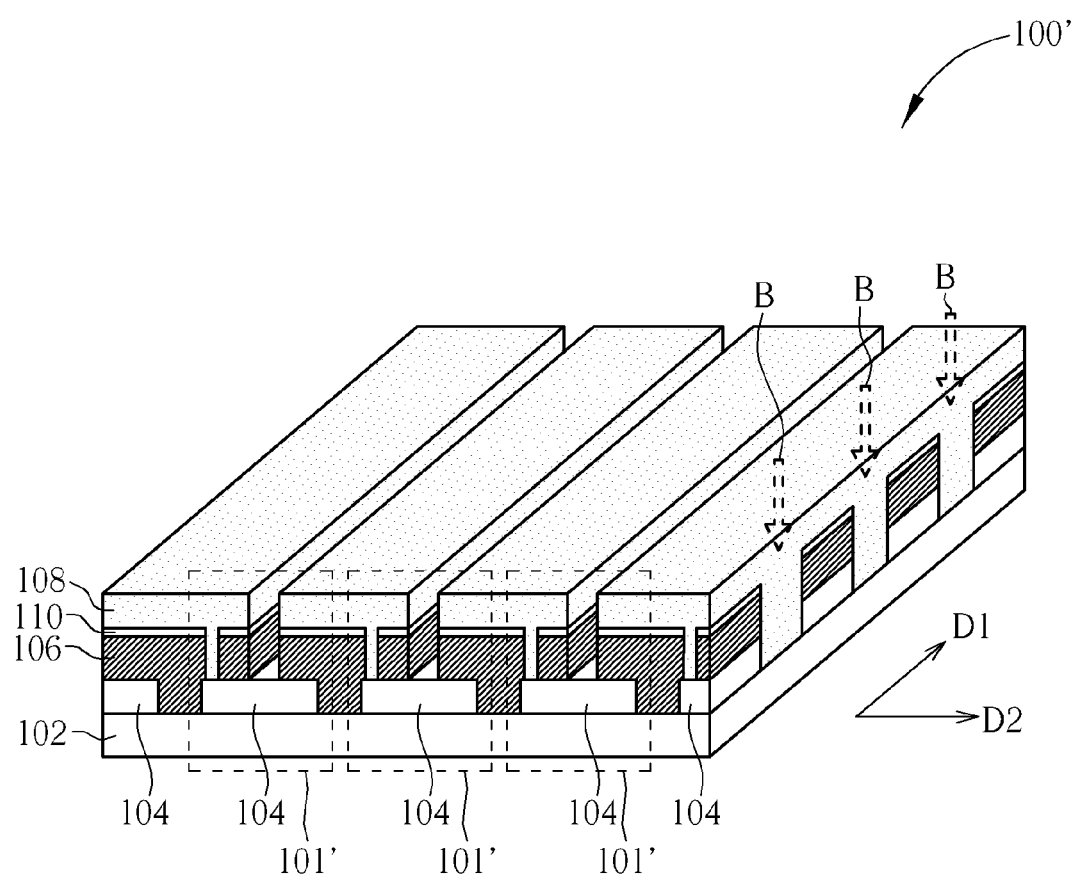

Finally, after the transparent electrode layer 108 is formed on the buffer layer 110 and the metal electrode layer 104 (Step 1116), the part of the transparent electrode layer 108, the part of the buffer layer 110, and the part of photoelectric transducing layer 106 are removed along the first direction D1 (Step 1118). In such a manner, the see-through solar battery module 100' can include the plurality of solar batteries 101', and the metal electrode layer 104 and the transparent electrode layer 108 of each solar battery 101' are in series connection along the second direction D2. Each transparent area (indicated by arrows B) of the see-through solar battery module 100' are formed by the transparent electrode layer 108 and the transparent substrate 102 for passing the beams, so that directions of the illumination fringes are different from the disposition of the solar battery 101'. Furthermore, as shown in FIG. 17, the transparent electrode layer 108 can be simultaneously formed on the buffer layer 110, the metal electrode layer 104 and the transparent substrate 102. Thus, for further improving transmittance of the see-through solar battery module 100', a scraper or other removing technology can be utilized to the part of each transparent electrode layer 108 located on the transparent substrate 102 along the second direction D2 after the transparent electrode layers 108 are formed by the thin film deposition technology. Similarly, the present invention can utilize the design that the second mask 114' is kept located above the transparent substrate 102 during the forming process of the transparent electrode layer 108 instead, for achieving the purpose of preventing transparent electrode layer 108 from being formed on the transparent substrate 102.

In summary, method of the present invention can prevent the metal electrode layer 104 and the photoelectric transducing layer 106 from being formed on the part of the transparent substrate 102 by utilizing the first mask 112' and the second mask 114', or further prevent forming of the buffer layer 110 and the transparent electrode layer 108 on the part of transparent substrate 102. Thus, compared with the see-through solar battery module 100, transmittance of the see-through solar battery module 100' can be further improved. Similarly, material and manufacturing procedures of the buffer layer 110 are not limited to the above-mentioned embodiment, meaning that Step 1112 is an omissible procedure.

Compare with the prior art, the present invention utilizes the mask to prevent the metal electrode layer and the photoelectric transducing layer from being formed on a part of the transparent substrate or further prevent forming of the buffer layer and the transparent electrode layer on the part of transparent substrate. In such a manner, if the present invention utilizes the design that the mask has the holes formed longitudinally relative to the transparent substrate, the see-through solar battery module of the present invention not only has preferable transmittance, but also simplifies the manufacturing process of the see-through solar battery module and solves the current leaking problem caused by omitting the step of utilizing the laser removing method.

On the other hand, if the present invention utilizes the design that the mask has the holes formed transversely relative to the transparent substrate, the see-through solar battery module of the present invention can have better transmittance. The present invention can adjust the size of the transparent areas (corresponding to the remaining portion on the mask besides the holes) of the see-through solar battery module easily by controlling the size of each hole on the mask. In addition, the interval between each two adjacent solar batteries can be further minimized if the transparent electrode layer, the photoelectric transducing layer and the buffer layer are partially removed by additionally utilizing a removing process (e.g. utilizing a scraper).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a see-through solar battery module, the method comprising:
    disposing a first mask above a transparent substrate;
    forming a plurality of metal electrode layers alternately arranged on the transparent substrate;
    disposing a second mask above the transparent substrate;
    forming a photoelectric transducing layer on each metal electrode layer by the second mask;
    removing a part of each photoelectric transducing layer along a first direction to expose a part of each metal electrode layer;
    forming a transparent electrode layer on each photoelectric transducing layer and each metal electrode layer; and
    removing a part of each transparent electrode layer and a part of each photoelectric transducing layer to expose a part of each metal electrode layer so as to make the plurality of metal electrode layers and the transparent electrode layer in series connection respectively along a second direction different from the first direction.

2. The method of claim 1 further comprising:
    cleaning the transparent substrate before forming the plurality of metal electrode layers alternately arranged on the transparent substrate.

3. The method of claim 1 further comprising:
    forming a buffer layer on each photoelectric transducing layer.

4. The method of claim 3, wherein forming the buffer layer on each photoelectric transducing layer comprises:
    forming the buffer layer on each photoelectric transducing layer and the transparent substrate; and
    removing a part of the buffer layer located on the transparent substrate.

5. The method of claim 3, wherein forming the buffer layer on each photoelectric transducing layer comprises:
    forming the buffer layer on each photoelectric transducing layer by the second mask.

6. The method of claim 1, wherein disposing the first mask above the transparent substrate comprises disposing the first mask having a plurality of first holes formed along the first direction above the transparent substrate, and disposing the second mask above the transparent substrate comprises disposing the second mask having a plurality of second holes formed along the first direction above the transparent substrate.

7. The method of claim 1, wherein disposing the first mask above the transparent substrate comprises disposing the first mask having a plurality of first holes formed along the second direction above the transparent substrate, and disposing the second mask above the transparent substrate comprises disposing the second mask having a plurality of second holes formed along the second direction above the transparent substrate.

8. The method of claim 7, wherein forming the plurality of metal electrode layers alternately arranged on the transparent substrate comprises:
    removing a part of each metal electrode layer along the first direction to expose parts of the transparent substrate.

9. The method of claim 7, wherein forming the transparent electrode layer on each photoelectric transducing layer and each metal electrode layer comprises:
    forming the transparent electrode layer on each photoelectric transducing layer, each metal electrode layer and the transparent substrate; and
    removing a part of the transparent electrode layer located on the transparent substrate along the second direction.

10. The method of claim 7, wherein forming the transparent electrode layer on each photoelectric transducing layer and each metal electrode layer comprises:
    forming the transparent electrode layer on each photoelectric transducing layer and each metal electrode layer by the second mask.

11. The method of claim 1, wherein removing the part of each photoelectric transducing layer along the first direction comprises:
    utilizing a scraper to remove the part of the each photoelectric transducing layer along the first direction.

12. The method of claim 1, wherein removing the part of each transparent electrode layer and the part of each photoelectric transducing layer along the first direction comprises:
    utilizing a scraper to remove the part of each transparent electrode layer and the part of each photoelectric transducing layer along the first direction.

13. The method of claim 1, wherein the first direction is substantially perpendicular to the second direction.

* * * * *